United States Patent
Lin et al.

(10) Patent No.: US 8,841,694 B2
(45) Date of Patent: Sep. 23, 2014

(54) LED MODULE WITH SEPARATE HEAT-DISSIPATION AND ELECTRICAL CONDUCTION PATHS, AND RELATED HEAT DISSIPATION BOARD

(71) Applicant: LITUP Technology Co. Ltd., Taoyuan County (TW)

(72) Inventors: Chih-Chen Lin, New Taipei (TW); Tsung-I Lin, Taoyuan County (TW); Ying-Che Sung, Taoyuan County (TW)

(73) Assignee: LITUP Technology Co. Ltd., Bade (TW)

( * ) Notice: Subject to any disclaimer, the term of this patent is extended or adjusted under 35 U.S.C. 154(b) by 0 days.

(21) Appl. No.: 13/836,732

(22) Filed: Mar. 15, 2013

(65) Prior Publication Data
US 2014/0167076 A1 Jun. 19, 2014

(30) Foreign Application Priority Data
Dec. 14, 2012 (TW) .................... 101224363

(51) Int. Cl.
*H01L 29/22* (2006.01)
*H01L 33/00* (2010.01)
*H01L 29/227* (2006.01)
*H01L 29/24* (2006.01)
*H01L 23/34* (2006.01)
*H01L 23/28* (2006.01)
*H05K 7/20* (2006.01)
*F21V 7/05* (2006.01)
*H01L 33/64* (2010.01)

(52) U.S. Cl.
CPC ............ *H01L 33/642* (2013.01); *H05K 7/2039* (2013.01); *F21V 7/05* (2013.01)

USPC ............... 257/99; 257/98; 257/100; 257/712; 257/713; 257/723; 257/796; 257/E33.056; 257/E33.057; 257/E33.058; 257/E33.059

(58) Field of Classification Search
CPC ..... H01L 23/142; H01L 27/153; H01L 33/08; H01L 33/64; H01L 33/405; H01L 51/5271; H01L 2224/45; H01L 2224/48257
USPC ............. 257/99, 100, 712, 713, 723, 796, 98, 257/E33.056, E33.057, E33.058, E33.059
See application file for complete search history.

(56) References Cited

U.S. PATENT DOCUMENTS

| 3,650,648 | A | 3/1972 | Lambrecht | |
|---|---|---|---|---|
| 5,833,903 | A | 11/1998 | Centofante | |
| 6,124,152 | A | 9/2000 | Yim | |
| 6,909,123 | B2 * | 6/2005 | Hayashimoto et al. | 257/98 |
| 7,719,021 | B2 * | 5/2010 | Harrah et al. | 257/98 |

(Continued)

*Primary Examiner* — Ida M Soward
(74) *Attorney, Agent, or Firm* — Birch, Stewart, Kolash & Birch, LLP

(57) ABSTRACT

A LED module with separate heat-dissipation and electrical conduction paths is disclosed, having a metal substrate; a plastic layer, including one or more hollow regions, and attached to the metal substrate; one or more conducting elements attached to the plastic layer; one or more LED chips positioned in the one or more hollow regions of the plastic layer and directly attached to the metal substrate; and a plurality of conducting wires for electrically connecting the one or more conducting elements and the one or more LED chips; wherein inner sides of the one or more hollow regions include one or more inclined surfaces each having an included angle with an upper surface of the metal substrate, and the included angle is between 90~180 degrees.

21 Claims, 5 Drawing Sheets

(56) References Cited

U.S. PATENT DOCUMENTS

| | | | |
|---|---|---|---|
| 7,855,761 B2 * | 12/2010 | Watanabe et al. | 349/58 |
| 7,999,277 B2 * | 8/2011 | Fushimi et al. | 257/98 |
| 8,316,534 B2 * | 11/2012 | Hwu et al. | 29/832 |
| 2002/0006040 A1 * | 1/2002 | Kamada et al. | 362/237 |
| 2005/0280019 A1 * | 12/2005 | Konno | 257/100 |
| 2006/0267042 A1 * | 11/2006 | Izuno et al. | 257/100 |
| 2007/0187705 A1 * | 8/2007 | Tanaka et al. | 257/98 |
| 2008/0258157 A1 * | 10/2008 | Wang | 257/88 |
| 2009/0065791 A1 * | 3/2009 | Yen et al. | 257/98 |
| 2009/0086431 A1 * | 4/2009 | Sakamoto et al. | 361/695 |
| 2009/0090928 A1 * | 4/2009 | Mori et al. | 257/99 |
| 2009/0103276 A1 * | 4/2009 | Sakamoto et al. | 361/792 |
| 2009/0134421 A1 * | 5/2009 | Negley | 257/98 |
| 2010/0128436 A1 * | 5/2010 | Edmunds et al. | 361/700 |
| 2010/0193825 A1 * | 8/2010 | Yang | 257/99 |
| 2011/0297990 A1 * | 12/2011 | Shimizu et al. | 257/98 |
| 2012/0032226 A1 * | 2/2012 | Su et al. | 257/99 |
| 2013/0161670 A1 * | 6/2013 | Peng | 257/98 |
| 2013/0215584 A1 * | 8/2013 | Klein et al. | 361/760 |

* cited by examiner

LED MODULE WITH SEPARATE HEAT-DISSIPATION AND ELECTRICAL CONDUCTION PATHS, AND RELATED HEAT DISSIPATION BOARD

CROSS-REFERENCE TO RELATED APPLICATIONS

This application claims the benefit of priority to Patent Application No. 101224363, filed in Taiwan on Dec. 14, 2012; the entirety of which is incorporated herein by reference for all purposes.

BACKGROUND

The disclosure generally relates to a LED module and, more particularly, to the LED module with separate heat-dissipation and electrical conduction paths, and related heat dissipation board.

As the demand for LED with higher luminosity increases, the power consumption of a single LED chip has increased to several watts, or even more than ten watts. In order to improve the luminosity of the LED chip, vast resources should be put into the research of related materials, but a breakthrough development is difficult to achieve in the short term.

Moreover, a large portion of the input energy of the high power LED would be converted into heat. If the heat cannot be timely dissipated, the temperature of the LED chip increases. The increasing temperature not only causes reduction in the LED chip brightness but also accelerates the deterioration of the chip and the encapsulating materials, thereby reducing the luminous efficiency and durability of the product. In general, more waste heat would be generated as the power of the LED chip increases. If the heat dissipation problem of the LED packaging structure cannot be effectively resolved, it will be obstructive to the development and application of the LED chips.

SUMMARY

In view of the foregoing, it can be appreciated that a substantial need exists for apparatuses that can improve luminous efficiency of a LED module while increasing the heat dissipation effect of the LED module.

An example embodiment of a LED module with separate heat-dissipation and electrical conduction paths is disclosed, comprising: a metal substrate; a plastic layer, comprising one or more hollow regions, and attached to the metal substrate; one or more conducting elements attached to the plastic layer; one or more LED chips positioned in the one or more hollow regions of the plastic layer and directly attached to the metal substrate; and a plurality of conducting wires for electrically connecting the one or more conducting elements and the one or more LED chips; wherein inner sides of the one or more hollow regions comprise one or more inclined surfaces each having an included angle with an upper surface of the metal substrate, and the included angle is between 90~180 degrees.

Another example embodiment of a LED module with separate heat-dissipation and electrical conduction paths is disclosed, comprising: a metal substrate; a plastic layer, comprising one or more hollow regions, and attached to the metal substrate, wherein inner sides of the one or more hollow regions comprise one or more inclined surfaces each having an included angle with an upper surface of the metal substrate, and the included angle is between 90~180 degrees; one or more conducting elements attached to the plastic layer; one or more LED chips positioned in the one or more hollow regions of the plastic layer and directly attached to the metal substrate; a plurality of conducting wires for electrically connecting the one or more conducting elements and the one or more LED chips; and a control circuit electrically connected with the one or more conducting elements, at least a part of the control circuit being covered by the plastic layer, and the control circuit driving different ones of the one or more LED chips at different time points; wherein a perimeter of the plastic layer is greater than or equal to a perimeter of the metal substrate, an area of the plastic layer is greater than or equal to an area of the metal substrate, the plastic layer covers partial or all sides of the metal substrate, and the plastic layer covers a portion of a lower surface of the metal substrate.

An example embodiment of a heat dissipation board is disclosed, comprising: a metal substrate; a plastic layer, comprising one or more hollow regions, and attached to the metal substrate; and one or more conducting elements attached to the plastic layer; wherein inner sides of the one or more hollow regions comprise one or more inclined surfaces each having an included angle with an upper surface of the metal substrate, and the included angle is between 90~180 degrees.

Another example embodiment of a heat dissipation board is disclosed, comprising: a metal substrate; a plastic layer, comprising one or more hollow regions, and attached to the metal substrate, wherein inner sides of the one or more hollow regions comprise one or more inclined surfaces each having an included angle with an upper surface of the metal substrate, and the included angle is between 90~180 degrees; one or more conducting elements attached to the plastic layer; and a control circuit electrically connected with the one or more conducting elements and at least a part of the control circuit being covered by the plastic layer; wherein a perimeter of the plastic layer is greater than or equal to a perimeter of the metal substrate, an area of the plastic layer is greater than or equal to an area of the metal substrate, the plastic layer covers partial or all sides of the metal substrate, and the plastic layer covers a portion of a lower surface of the metal substrate.

One of the advantages of the above embodiments is that the heat generated during the operations of the LED module can be directly conducted to the metal substrate and then rapidly conducted to external environments via the metal substrate, thereby achieving good heat dissipation effect.

Another advantage of the above embodiments is that the plastic layer increases the robustness of the combination of the plastic layer and the metal substrate after the plastic layer is attached to the metal substrate, thereby further enhancing the structural rigidity of the heat dissipation board.

Another advantage of the above embodiments is that the inclined surfaces of the plastic layer is beneficial to reflect a portion of lights emitted by the LED module to a light outputting direction of the LED module, thereby improving the overall luminous efficiency and lighting effect of the LED module.

Another advantage of the above embodiments is that only the hollow regions of the plastic layer need to be coated with LED adhesive, and other regions outside the hollow regions need not to be coated with the LED adhesive. Accordingly, the amount of the LED adhesive required for packaging the LED module can be effectively reduced.

It is to be understood that both the foregoing general description and the following detailed description are example and explanatory only and are not restrictive of the invention, as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
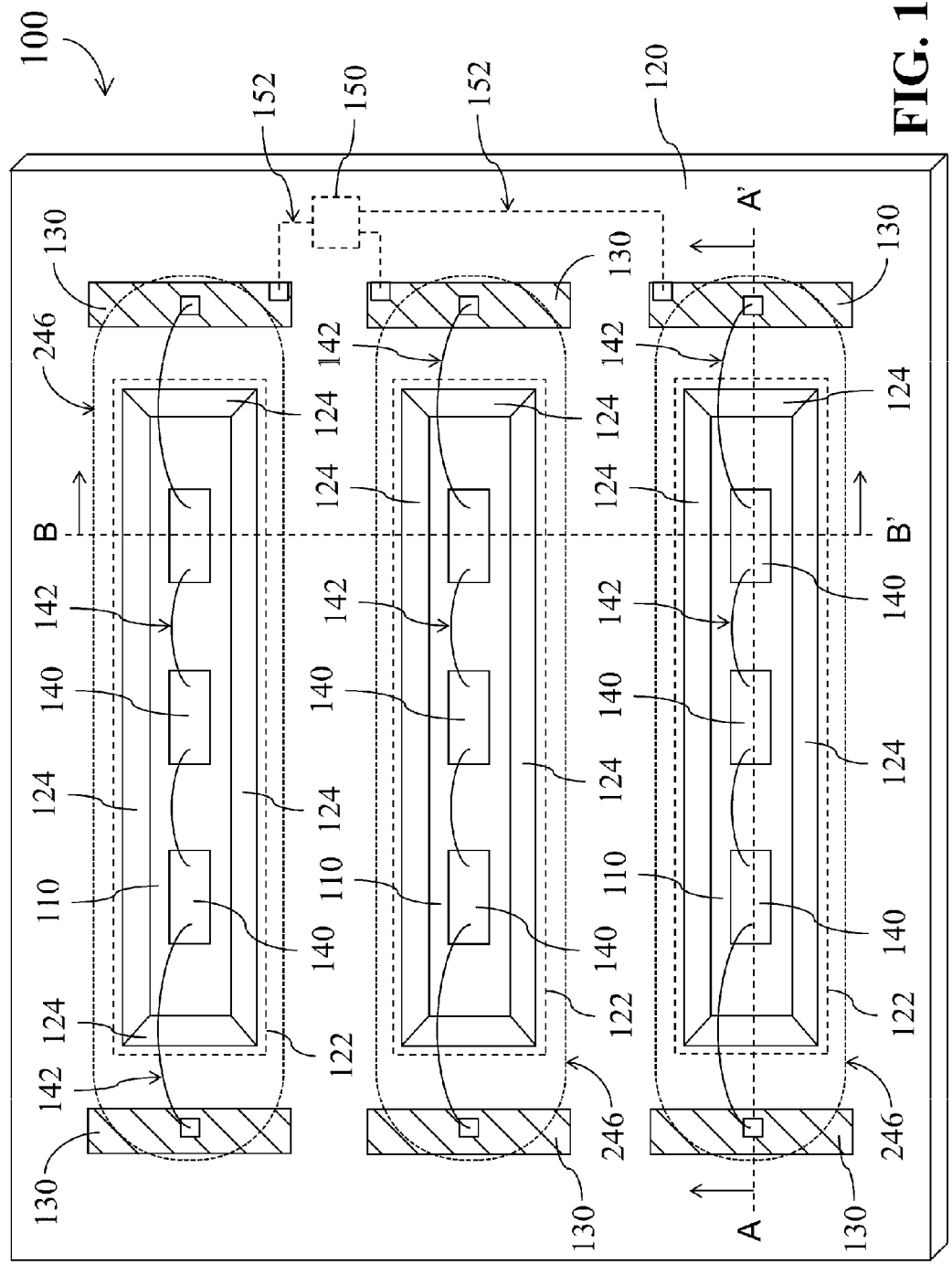
FIG. 1 shows a simplified schematic diagram of a LED module according to one embodiment of the present disclosure.

Please refer to FIG. 1, which shows a simplified top view of a LED module 100 according to one embodiment of the present disclosure. The LED module 100 comprises a heat dissipation board. The main body of the heat dissipation board comprises a metal substrate 110, a plastic layer 120, and one or more conducting elements 130. The plastic layer 120 comprises one or more rectangular hollow regions 122, and is attached to the metal substrate 110 and the conducting elements 130. The plastic layer 120 may isolate the metal substrate 110 and the conducting elements 130. In the embodiment shown in FIG. 1, the plastic layer 120 comprises multiple rectangular hollow regions 122 and an inner side of each of the rectangular hollow regions 122 comprises one or more inclined surfaces 124. Each of the inclined surfaces 124 has an included angle with an upper surface of the metal substrate 110, and the included angle is between 90~180 degrees.

In addition, the LED module 100 further comprises one or more LED chips 140 and multiple conducting wires 142. In the embodiment shown in FIG. 1, the LED module 100 comprises multiple LED chips 140. As shown in FIG. 1, the aforementioned LED chips 140 are respectively positioned in the multiple hollow regions 122 of the plastic layer 120, and directly attached to the metal substrate 110. Some of the conducting wires 142 are respectively utilized for electrically connecting one of the conducting elements 130 and one of the LED chips 140, and the other conducting wires 142 are respectively utilized for electrically connecting different LED chips 140.

In practice, the metal substrate 110 may be realized by materials with high reflectivity, such as mirror aluminum, in order to improve the overall luminous efficiency of the LED module 100. When the metal substrate 110 is realized by materials with lower reflectivity, the bare portion of the metal substrate 110 may be covered by materials with high reflectivity to improve the overall luminance of the LED module 100.

The implementations of the LED module 100 will be further described below with reference to FIGS. 2~3.

Figure 2:
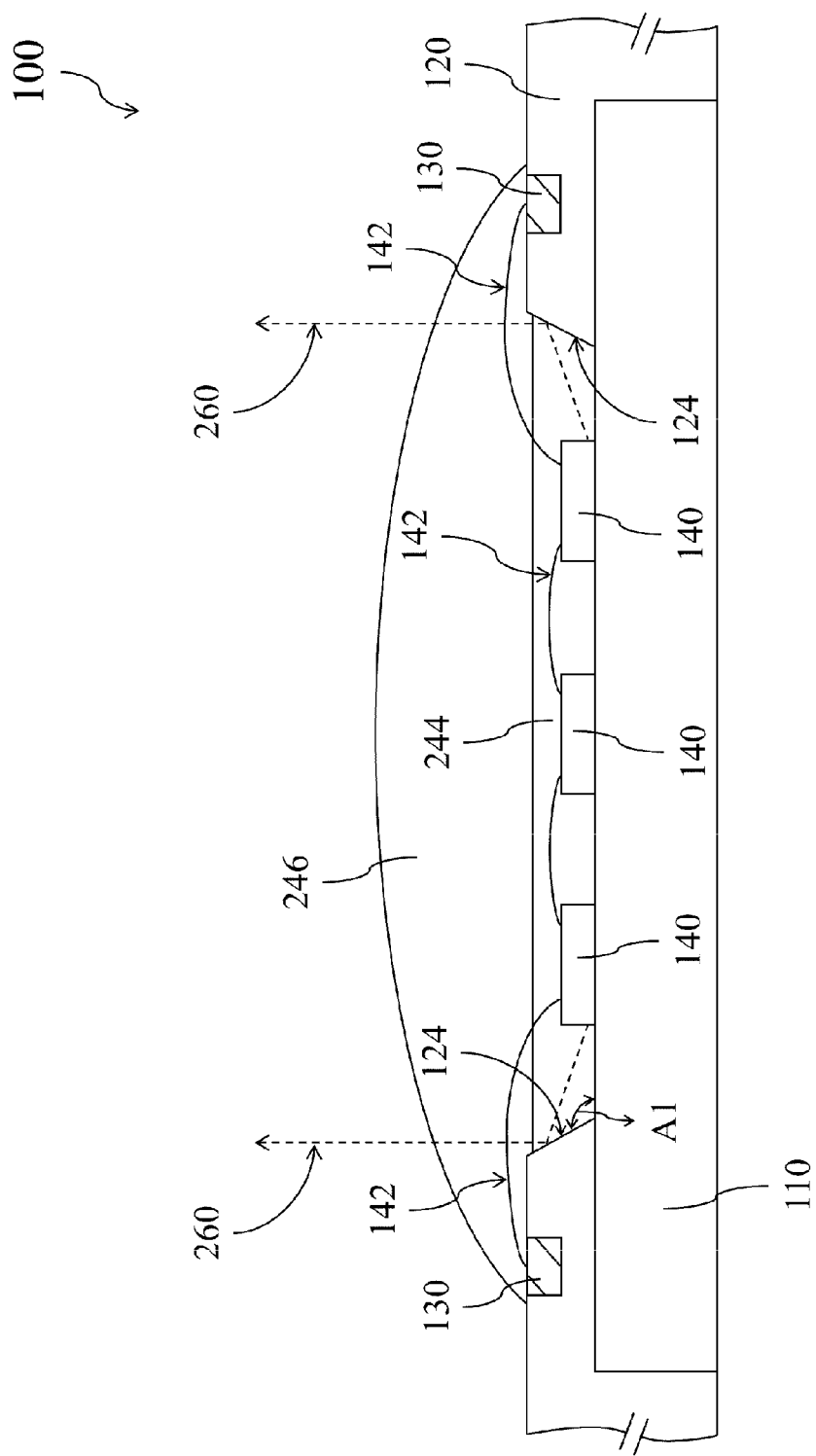
FIG. 2 is a simplified cross-sectional diagram of the LED module of FIG. 1 along the direction A-A' according to one embodiment of the present disclosure.

FIG. 2 shows a simplified cross-sectional diagram of the LED module 100 along the direction A-A' according to one embodiment of the present disclosure. FIG. 3 shows a simplified cross-sectional diagram of the LED module 100 along the direction B-B' according to one embodiment of the present disclosure. As shown in FIG. 2 and FIG. 3, the plastic layer 120 is directly attached to the metal substrate 110 and also directly attached to the conducting elements 130.

When assembling the heat dissipation board of the LED module 100, the metal substrate 110 and the conducting elements 130 may be arranged to have a proper spacing between the metal substrate 110 and the conducting elements 130. Then, an injection molding approach may be employed to inject an insulating plastic material in liquid form into the spacing between the metal substrate 110 and the conducting element 130 to form the aforementioned plastic layer 120, so that the plastic layer 120 is directly attached to the metal substrate 110 and the conducting elements 130. The insulating plastic material may be a liquid crystal polymer (LOP), and thus the plastic layer 120 may be a LCP layer. The assembling process of the heat dissipation board is accomplished when the plastic layer 120 is cured.

In some embodiments, the insulating plastic material may be a polyphenylene sulfide (PPS) or a polyphthalamide (PPA), and thus the plastic layer 120 may be a PPS layer or a PPA layer. For example, the plastic layer may be formed by a thermally conductive polyphenylene sulfide having a thermal conductive coefficient between 2 W/mK and 30 W/mK and having a heat distortion temperature between 260 degrees Celsius and 290 degrees Celsius. The aforementioned thermal conductivity coefficient may be 10 W/mK, 15 W/mK, or 20 W/mK, and the aforementioned heat distortion temperature may be 280 degrees Celsius.

In practice, the plastic layer 120 may not only attach to the metal substrate 110 but also cover partial or all sides of the metal substrate 110 to increase the robustness of the combination of the plastic layer 120 and the metal substrate 110 after the plastic layer 120 is attached to the metal substrate 110. The plastic layer 120 may even cover a portion of a lower surface of the metal substrate 110 to increase a structure rigidity of the aforementioned heat dissipation board.

In addition, a perimeter of the plastic layer 120 may be greater than or equal to a perimeter of the metal substrate 110 and an area of the plastic layer 120 may be greater than or equal to an area of the metal substrate 110 so as to increase the contacting area between the plastic layer 120 and the metal substrate 110. In this way, after the plastic layer 120 is attached to the metal substrate 110, the robustness of the combination of the plastic layer 120 and the metal substrate 110 can be increased and the metal substrate 110 can be better protected so as to avoid scratching and prevent the metal substrate 110 from oxidation.

Similarly, the plastic layer 120 may not only attach to the conducting elements 130, but also cover partial or all sides of the conducting elements 130, or even cover a portion of an upper surface of the conducting elements 130 to increase the robustness of the combination of the plastic layer 120 and the conducting elements 130 after the plastic layer 120 is attached to the conducting elements 130, thereby providing a certain degree of protection for the conducting elements 130.

Figure 3:
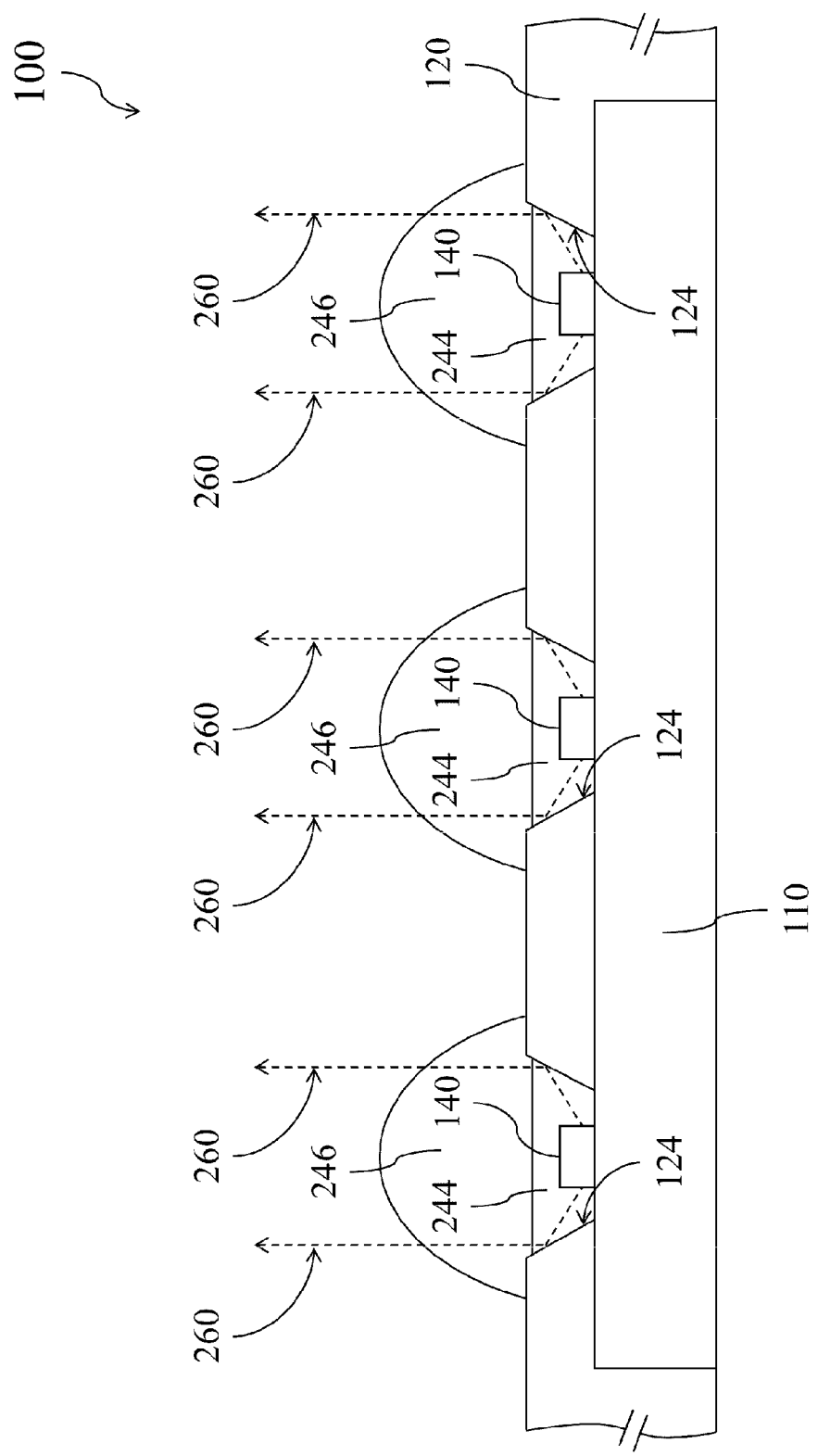
FIG. 3 is a simplified cross-sectional diagram of the LED module of FIG. 1 along the direction B-B' according to one embodiment of the present disclosure.

As shown in FIG. 2 and FIG. 3, the inner side of each of the hollow regions 122 of the plastic layer 120 comprises multiple inclined surfaces 124 and each of the inclined surfaces 124 has an included angle A1 with the upper surface of the metal substrate 110. The included angle A1 is between 90~180 degrees. When assembling the heat dissipation board, an injection molding approach may be employed to cooperate with a mold having an appropriate shape to form the plastic layer 120 having multiple hollow regions 122 and to integrally form one or more inclined surfaces 124 in the inner side of each hollow region 122 at the same time. As a result, no additional manufacturing process is required for forming the inclined surfaces 124 after the plastic layer 120 is formed, thereby expediting the assembling process of the heat dissipation board of the LED module 100.

After completing the assembling process of the heat dissipation board, the multiple LED chips 140 may be respectively positioned in the multiple hollow regions 122. Each of the LED chips 140 may be coupled on the metal substrate 110 by utilizing a chip on board (COB) approach or other methods.

The LED chips 140 may be electrically connected with the conducting elements 130 above the plastic layer 120 through the conducting wires 142. The conducting elements 130 may be covered by a solder mask layer for protecting the conducting elements 130.

When assembling the LED module 100, the LED adhesive in liquid form may be coated onto the hollow region 122 of the plastic layer 120 to form an encapsulation layer 244 for covering the LED chips 140 and the related conducting wires 142. The encapsulation layer 244 is capable of protecting the LED chips 140. In practice, phosphor powder particles may be mixed into the aforementioned LED adhesive to control the color and color rendering property of the LED module 100.

Afterwards, the metal substrate 110 and a lens layer 246 are aligned and engaged with each other. Then, bonding glue in liquid form is injected into the spacing between the encapsulation layer 244 and the lens layer 246 and fills the spacing as much as possible. The lens layer 246 and the encapsulation layer 244 would be adhered together after the bonding glue is cured. The lens layer 246 may be made by silicone, epoxy resin, or acrylic, or may be made by the combination of at least two of the above materials.

In practice, the metal substrate 110 may be directly aligned and engaged with the lens layer 246 after the LED chips 140 are electrically connected with the conducting elements 130 through the conducting wires 142. Then, the LED adhesive in liquid form may be injected into the spacing between the metal substrate 110 and the lens layer 246. The lens layer 246 and the metal substrate 110 would be adhered together after the LED adhesive is cured, thereby forming the encapsulation layer 244 for covering the LED chips 140 and the related conducting wires 142.

Alternatively, the LED adhesive in liquid form may be coated onto the hollow region 122 of the plastic layer 120 to form the encapsulation layer 244 for covering the LED chips 140 and the related conducting wires 142. Then, the lens layer 246 may be directly formed on the encapsulation layer 244 by utilizing an insert molding approach.

Alternatively, the functionalities of the aforementioned encapsulation layer 244 and lens layer 246 may be realized by a single layer structure. For example, a LED adhesive with high cohesion may be coated onto the hollow region 122 of the plastic layer 120 to cover the LED chips 140 and the related conducting wires 142. When the LED adhesive is cured, a lens layer 246 having the functionality of the encapsulation layer 244 is formed. By adopting this approach, the required time for packaging the LED chips 140 can be further reduced.

Since only the hollow region 122 of the plastic layer 120 need to be coated with the LED adhesive, and other regions outside the hollow regions 122 need not to be coated with the LED adhesive, the amount of the LED adhesive required for packaging the LED module 100 can be effectively reduced.

As described previously, the LED chips 140 are positioned in the hollow regions 122 of the plastic layer 120 and the inner side of the hollow region 122 comprises the one or more inclined surfaces 124. Thus, as shown in FIG. 2 and FIG. 3, when light 260 emitted by the LED chips 140 irradiates to the inclined surfaces 124, the light 260 would be reflected to a light outputting direction of the LED module 100, thereby improving the overall luminous efficiency and lighting effect of the LED module 100.

In practice, the aforementioned one or more inclined surfaces 124 may be coated with materials having high reflectivity or may be respectively covered by one or more reflecting sheets in order to enhance the light reflection.

As shown in FIG. 1, the LED module 100 may further comprise a control circuit 150 configured to operably perform voltage conversion and/or to operably drive the LED chips 140. In addition, the LED module 100 may comprise a plurality of conducting wires 152 respectively utilized for electrically connecting the control circuit 150 and the multiple conducting elements 130.

In practice, the control circuit 150 may be embedded in the heat dissipation board of the LED module 100 in order to protect the control circuit 150. For example, when assembling the heat dissipation board of the LED module 100, the metal substrate 110 and the conducting elements 130 may be arranged to have a proper spacing between the metal substrate 110 and the conducting elements 130, and the control circuit 150 may be positioned on an appropriate location on the metal substrate 110. Then, the insulating plastic material in liquid form is injected into the spacing between the metal substrate 110 and the conducting elements 130 to form the aforementioned plastic layer 120. The plastic layer 120 is directly attached to the metal substrate 110 and the conducting elements 130, and covers at least a portion of the control circuit 150. In addition, the plurality of conducting wires 152 connected to the control circuit 150 may be covered by the plastic layer 120, the encapsulation layer 244, or the lens layer 246 as well by utilizing the approach described previously so as to protect the related conducting wires 152.

In conventional assembling process of a LED module, an insulating layer is arranged between a control circuit and a metal substrate, and the insulating layer does not cover the control circuit in order to not adversely affect the heat dissipation effect of the control circuit. In the proposed LED module 100, however, the plastic layer 120 covers a portion of or the entire control circuit 150 to prevent the control circuit 150 from being damaged by scratching or hits, thereby effectively improving the protection to the control circuit 150.

In operations, the control circuit 150 may convert an input voltage of the LED module 100 into an output voltage with appropriate magnitude. In addition, the control circuit 150 may output powers having different magnitudes at different time points to drive all of the LED chips 140 of the LED module 100, or may drive different LED chips 140 of the LED module 100 at different time points so that the LED module 100 is enabled to present various lighting effects, such as sectional lighting, flicking, showing rolling script, or showing specific patterns.

Figure 4:
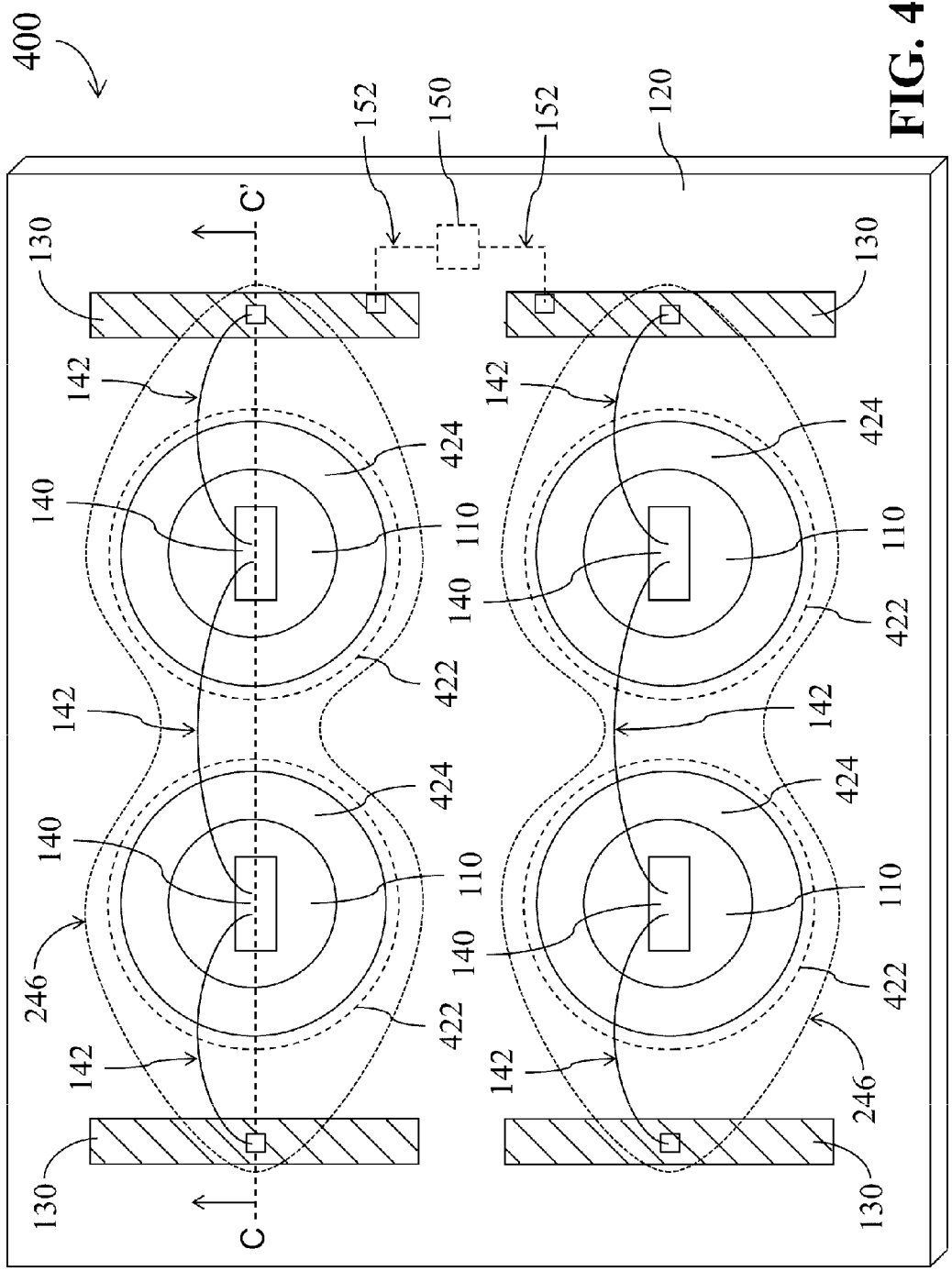
FIG. 4 shows a simplified schematic diagram of a LED module according to another embodiment of the present disclosure.

Please refer to FIG. 4, which shows a simplified top view of a LED module 400 according to another embodiment of the present disclosure. The LED module 400 comprises the heat dissipation board whose main body comprises the metal substrate 110, the plastic layer 120, and one or more conducting elements 130. The LED module 400 is similar to the aforementioned LED module 100. A difference between the two embodiments is in the amount and shape of the hollow regions in the plastic layer 120. In the LED module 400, the plastic layer 120 comprises multiple circular hollow regions 422 and the inner side of each of the hollow regions 422 comprises an annular inclined surface 424.

Figure 5:
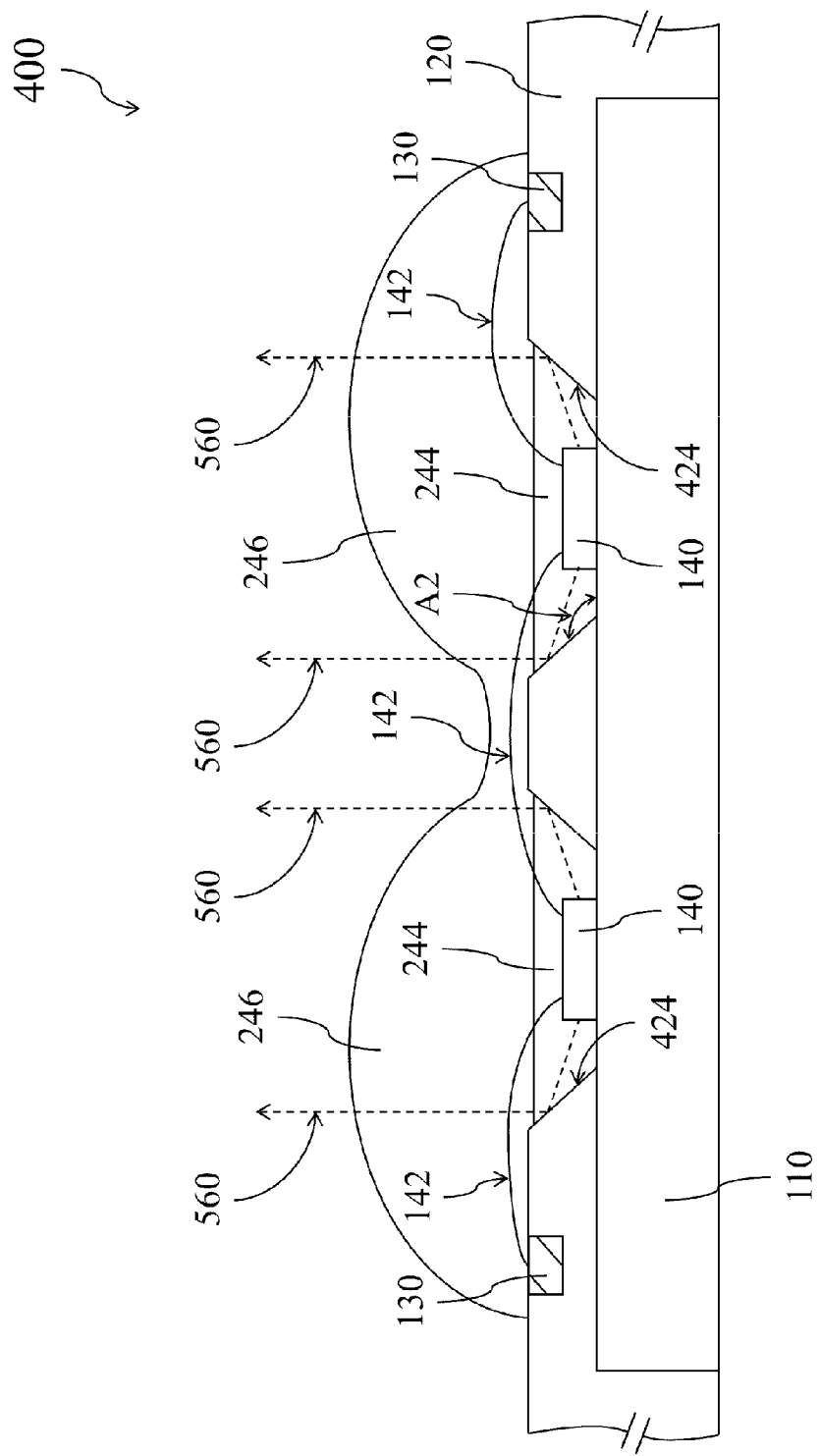
FIG. 5 is a simplified cross-sectional diagram of the LED module of FIG. 4 along the direction C-C' according to one embodiment of the present disclosure.

FIG. 5 shows a simplified cross-sectional diagram of the LED module 400 along the direction C-C' according to one embodiment of the present disclosure.

As shown in FIG. 5, the annular inclined surface 424 in the inner side of each hollow region 422 has an included angle A2 with the upper surface of the metal substrate 110. The included angle A2 is between 90~180 degrees. When assembling the heat dissipation board, an injection molding approach may be employed to cooperate with a mold having an appropriate shape to form the plastic layer 120 having multiple hollow regions 422 and to integrally form a single inclined surface 424 in the inner side of each hollow region 422 at the same time. As a result, no additional manufacturing process is required for forming the inclined surface 424 after the plastic layer 120 is formed, thereby expediting the assembling process of the heat dissipation board of the LED module 400.

After completing the assembling process of the heat dissipation board, the multiple LED chips 140 may be respectively positioned in the multiple hollow regions 422. Each of the LED chips 140 may be coupled on the metal substrate 110 by utilizing the COB approach or other methods. In this embodiment, each of the hollow regions 422 is provided with only one of the multiple LED chips 140.

When assembling the LED module 400, the LED adhesive in liquid form may be coated onto the hollow region 422 of the plastic layer 120 to form the encapsulation layer 244 for covering the LED chips 140 and the related conducting wires 142. Afterwards, the metal substrate 110 and the lens layer 246 are aligned and engaged with each other. Then, the bonding glue in liquid form is injected into the spacing between the encapsulation layer 244 and the lens layer 246 and fills the spacing as much as possible. The lens layer 246 and the encapsulation layer 244 would be adhered together after the bonding glue is cured.

In practice, the metal substrate 110 may be directly aligned and engaged with the lens layer 246 after the LED chips 140 are electrically connected with the conducting elements 130 through the conducting wires 142. Then, the LED adhesive in liquid form may be injected into the spacing between the metal substrate 110 and the lens layer 246. The lens layer 246 and the metal substrate 110 would be adhered together after the LED adhesive is cured, thereby forming the encapsulation layer 244 for covering the LED chips 140 and the related conducting wires 142.

Alternatively, the LED adhesive in liquid form may be coated onto the hollow region 422 of the plastic layer 120 to form the encapsulation layer 244 for covering the LED chips 140 and the related conducting wires 142. Then, the lens layer 246 may be directly formed on the encapsulation layer 244 by utilizing the insert molding approach.

Alternatively, the functionalities of the aforementioned encapsulation layer 244 and lens layer 246 may be realized by the single layer structure. For example, a LED adhesive with high cohesion may be coated onto the hollow region 122 of the plastic layer 120 to cover the LED chips 140 and the related conducting wires 142. When the LED adhesive is cured, a lens layer 246 having the functionality of the encapsulation layer 244 is formed. By adopting this approach, the required time for packaging the LED chips 140 can be further reduced.

Since only the hollow region 422 of the plastic layer 120 need to be coated with the LED adhesive, and other regions outside the hollow regions 422 need not to be coated with the LED adhesive, the amount of the LED adhesive required for packaging the LED module 400 can be effectively reduced.

As described previously, the LED chips 140 are positioned in the hollow regions 422 of the plastic layer 120 and the inner side of the hollow region 422 comprises the inclined surface 424. Thus, as shown in FIG. 5, when light 560 emitted by the LED chips 140 irradiates to the inclined surface 424, the light 560 would be reflected to a light outputting direction of the LED module 400, thereby improving the overall luminous efficiency and lighting effect of the LED module 400.

In practice, the aforementioned one or more inclined surfaces 424 may be coated with materials having high reflectivity or may be respectively covered by one or more reflecting sheets in order to enhance the light reflection.

As shown in FIG. 4, the LED module 400 may further comprise the control circuit 150 configured to operably drive the LED chips 140, and the plurality of conducting wires 152 respectively utilized for electrically connecting the control circuit 150 to the multiple conducting elements 130. In practice, the control circuit 150 may be embedded in the heat dissipation board of the LED module 400 in order to protect the control circuit 150. For example, when assembling the heat dissipation board of the LED module 400, the metal substrate 110 and the conducting elements 130 may be arranged to have a proper spacing between the metal substrate 110 and the conducting elements 130, and the control circuit 150 may be positioned on an appropriate location on the metal substrate 110. Then, the insulating plastic material in liquid form is injected into the spacing between the metal substrate 110 and the conducting elements 130 to form the aforementioned plastic layer 120. The plastic layer 120 is directly attached to the metal substrate 110 and the conducting elements 130, and covers at least a portion of the control circuit 150. In addition, the plurality of conducting wires 152 connected to the control circuit 150 may be covered by the plastic layer 120 as well by utilizing the approach described previously so as to protect the related conducting wires 152.

Most components of the LED module 400 are similar to components labeled with the same reference numbers of the aforementioned LED module 100. Accordingly, the descriptions regarding the implementations, connections, and related advantages of other components in the LED module 100 are also applicable to the embodiments shown in FIG. 4 and FIG. 5. For simplicity, the descriptions will not be repeated here.

It can be appreciated by one skilled in the art that the amount, shape, and positions of the hollow regions and the inclined surfaces in the plastic layer 120 may be adjusted based on the circuit design requirements, and are not intended to be restrict to the patterns illustrated in the previous embodiments. For example, the plastic layer 120 may comprise multiple hollow regions of different shapes and sizes, and the inner side of each of the hollow regions may comprise multiple inclined surfaces of different shapes and sizes.

In addition, the inclined surfaces 124 or 424 of the aforementioned LED module 100 or 400 are continuous structures. This is merely an embodiment, rather than a restriction to the practical implementations. In practice, the inclined surfaces positioned on the inner side of the hollow regions may be multiple discontinuous surfaces.

As can be appreciated from the foregoing descriptions that the LED chip 140 is directly attached to the metal substrate 110 and no insulating layer is arranged between the LED chip 140 and the metal substrate 110. Thus, the heat generated by the LED module 400 during the operations can be directly conducted to the metal substrate 110 and then rapidly conducted to external environments via the metal substrate 110, thereby achieving good heat dissipation effect.

In addition, the plastic layer 120 attached to the metal substrate 110 not only increases the robustness of the combination of the plastic layer 120 and the metal substrate 110 after the plastic layer 120 is attached to the metal substrate 110, but also enhancing the structural rigidity of the heat dissipation board.

On the other hand, the inclined surfaces of the aforementioned plastic layer 120 is beneficial to reflect light emitted from the LED chips 140 to the light outputting direction of the LED module 100 or 400, thereby improving the overall luminous efficiency and lighting effect of the LED module 100 or 400.

In addition, since only the hollow region of the plastic layer 120 need to be coated with the LED adhesive, and other regions outside the hollow regions need not to be coated with the LED adhesive, the amount of the LED adhesive required for packaging the LED module 100 or 400 can be effectively reduced.

The same reference numbers may be used throughout the drawings to refer to the same or like parts, components, or operations. Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise. Throughout the description and claims, the term "element" contains the concept of component, layer, or region.

In the drawings, the size and relative sizes of some elements may be exaggerated or simplified for clarity. Accordingly, unless the context clearly specifies, the shape, size, relative size, and relative position of each element in the drawings are illustrated merely for clarity, and not intended to be used to restrict the claim scope.

For the purpose of explanatory convenience in the specification, spatially relative terms, such as "on," "above," "below," "beneath," "higher," "lower," "upward," "downward," and the like, may be used herein to describe the function of a particular element or to describe the relationship of one element to another element(s) as illustrated in the drawings. It will be understood that the spatially relative terms are intended to encompass different orientations of the element in use, in operations, or in assembly in addition to the orientation depicted in the drawings. For example, if the element in the drawings is turned over, elements described as "on" or "above" other elements would then be oriented "under" or "beneath" the other elements. Thus, the exemplary term "beneath" can encompass both an orientation of above and beneath.

Throughout the description and claims, it will be understood that when a component is referred to as being "positioned on," "positioned above," "connected to," "engaged with," or "coupled with" another component, it can be directly on, connected to, or engaged with the other component or intervening component may be present. In contrast, when a component is referred to as being "directly on," "directly connected to," or "directly engaged with" another component, there are no intervening components present.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A LED module with separate heat-dissipation and electrical conduction paths, comprising:
    a metal substrate;
    a plastic layer, comprising one or more hollow regions, and attached to the metal substrate;
    one or more conducting elements attached to the plastic layer;
    one or more LED chips positioned in the one or more hollow regions of the plastic layer and directly attached to the metal substrate;
    a control circuit electrically connected with the one or more conducting elements and at least a part of the control circuit being covered by the plastic layer; and
    a plurality of conducting wires for electrically connecting the one or more conducting elements and the one or more LED chips;
    wherein inner sides of the one or more hollow regions comprise one or more inclined surfaces each having an included angle with an upper surface of the metal substrate, and the included angle is between 90~180 degrees, and
    wherein the plastic layer covers partial or all sides of the metal substrate.

2. The LED module of claim 1, wherein a perimeter of the plastic layer is greater than or equal to a perimeter of the metal substrate.

3. The LED module of claim 2, wherein an area of the plastic layer is greater than or equal to an area of the metal substrate.

4. The LED module of claim 1, wherein the control circuit drives different ones of the one or more LED chips at different time points.

5. The LED module of claim 1, wherein each of the hollow regions is provided with only one of the one or more LED chips.

6. The LED module of claim 1, wherein the plastic layer covers partial surfaces of the one or more conducting elements.

7. The LED module of claim 1, wherein the one or more inclined surfaces are integrally formed on the inner sides of the one or more hollow regions.

8. The LED module of claim 1, further comprising:
    one or more reflecting sheets respectively covering the one or more inclined surfaces.

9. The LED module of claim 1, wherein the plastic layer is a liquid crystal polymer layer.

10. The LED module of claim 1, wherein the plastic layer is a thermally conductive polyphenylene sulfide layer.

11. A LED module with separate heat-dissipation and electrical conduction paths, comprising:
    a metal substrate;
    a plastic layer, comprising one or more hollow regions, and attached to the metal substrate, wherein inner sides of the one or more hollow regions comprise one or more inclined surfaces each having an included angle with an upper surface of the metal substrate, and the included angle is between 90~180 degrees;
    one or more conducting elements attached to the plastic layer;

one or more LED chips positioned in the one or more hollow regions of the plastic layer and directly attached to the metal substrate;

a plurality of conducting wires for electrically connecting the one or more conducting elements and the one or more LED chips; and a control circuit electrically connected with the one or more conducting elements, at least a part of the control circuit being covered by the plastic layer, and the control circuit driving different ones of the one or more LED chips at different time points;

wherein a perimeter of the plastic layer is greater than or equal to a perimeter of the metal substrate, an area of the plastic layer is greater than or equal to an area of the metal substrate, and the plastic layer covers partial or all sides of the metal substrate.

12. A heat dissipation board, comprising:

a metal substrate;

a plastic layer, comprising one or more hollow regions, and attached to the metal substrate;

one or more conducting elements attached to the plastic layer; and a control circuit electrically connected with the one or more conducting elements and at least a part of the control circuit being covered by the plastic layer;

wherein inner sides of the one or more hollow regions comprise one or more inclined surfaces each having an included angle with an upper surface of the metal substrate, and the included angle is between 90~180 degrees.

13. The heat dissipation board of claim 12, wherein a perimeter of the plastic layer is greater than or equal to a perimeter of the metal substrate.

14. The heat dissipation board of claim 13, wherein an area of the plastic layer is greater than or equal to an area of the metal substrate.

15. The heat dissipation board of claim 12, wherein the plastic layer covers partial or all sides of the metal substrate.

16. The heat dissipation board of claim 12, wherein the plastic layer covers partial surfaces of the one or more conducting elements.

17. The heat dissipation board of claim 12, wherein the one or more inclined surfaces are integrally formed on the inner sides of the one or more hollow regions.

18. The heat dissipation board of claim 12, further comprising:

one or more reflecting sheets respectively covering the one or more inclined surfaces.

19. The heat dissipation board of claim 12, wherein the plastic layer is a liquid crystal polymer layer.

20. The heat dissipation board of claim 12, wherein the plastic layer is a thermally conductive polyphenylene sulfide layer.

21. A heat dissipation board, comprising:

a metal substrate;

a plastic layer, comprising one or more hollow regions, and attached to the metal substrate, wherein inner sides of the one or more hollow regions comprise one or more inclined surfaces each having an included angle with an upper surface of the metal substrate, and the included angle is between 90~180 degrees;

one or more conducting elements attached to the plastic layer; and a control circuit electrically connected with the one or more conducting elements and at least a part of the control circuit being covered by the plastic layer;

wherein a perimeter of the plastic layer is greater than or equal to a perimeter of the metal substrate, an area of the plastic layer is greater than or equal to an area of the metal substrate, and the plastic layer covers partial or all sides of the metal substrate.

* * * * *